(12) United States Patent
Yang et al.

(10) Patent No.: US 8,782,488 B2
(45) Date of Patent: Jul. 15, 2014

(54) SYSTEMS AND METHODS FOR BACK STEP DATA DECODING

(75) Inventors: Shaohua Yang, Santa Clara, CA (US); Chung-Li Wang, San Jose, CA (US)

(73) Assignee: LSI Corporation, San Jose, CA (US)

(*) Notice: Subject to any disclaimer, the term of this patent is extended or adjusted under 35 U.S.C. 154(b) by 137 days.

(21) Appl. No.: 13/452,733

(22) Filed: Apr. 20, 2012

(65) Prior Publication Data

US 2013/0283113 A1    Oct. 24, 2013

(51) Int. Cl.
| | |
|---|---|
| *H03M 13/00* | (2006.01) |
| *G06F 11/00* | (2006.01) |
| *H04L 1/00* | (2006.01) |
| *G11C 29/00* | (2006.01) |
| *H03M 13/41* | (2006.01) |
| *H03M 13/37* | (2006.01) |
| *H03M 13/09* | (2006.01) |
| *H03M 13/11* | (2006.01) |
| *H03M 7/30* | (2006.01) |
| *G11B 20/18* | (2006.01) |
| *G06F 11/07* | (2006.01) |
| *G06F 11/22* | (2006.01) |

(52) U.S. Cl.
CPC ............ *H03M 13/00* (2013.01); *H03M 13/41* (2013.01); *H03M 13/3746* (2013.01); *H03M 13/093* (2013.01); *H03M 13/1102* (2013.01); *H03M 13/1108* (2013.01); *H03M 13/1128* (2013.01); *H03M 13/3723* (2013.01); *H03M 13/6511* (2013.01); *H03M 13/6513* (2013.01); *H03M 7/6005* (2013.01); *G11B 20/1833* (2013.01); *G11B 20/18* (2013.01); *G06F 11/07* (2013.01); *G06F 11/2215* (2013.01)

USPC ........... 714/758; 714/746; 714/752; 714/763; 714/773; 714/799; 714/780; 714/786; 714/800

(58) Field of Classification Search
CPC ................... G11B 20/1833; G11B 2020/1843; G11B 2020/185; G11B 2220/2516; G11B 2220/415; G11B 20/01; H03M 13/00; H03M 13/41; H03M 13/3746; H03M 13/093; H03M 13/1102; H03M 13/1108; H03M 13/1128; H03M 13/3723; H03M 13/6511; H03M 13/6513; H03M 7/6005; H03M 2020/1843
USPC ......... 714/746, 752, 758, 763, 773, 799, 780, 714/786, 800
See application file for complete search history.

(56) References Cited

U.S. PATENT DOCUMENTS 5,222,069 A * 6/1993 Chevalley .................. 714/765
5,731,922 A * 3/1998 Yamasaki et al. ............ 360/53

(Continued)

FOREIGN PATENT DOCUMENTS

JP        06046406 A * 2/1994 ............ H04N 7/137

OTHER PUBLICATIONS

Kang et al., "A Two-Stage Iterative Decoding of LDPC Codes for Lowering Error Floors", IEEE GLOBECOM Proceedings, 1088-1091 (2008).

(Continued)

*Primary Examiner* — John J Tabone, Jr.
(74) *Attorney, Agent, or Firm* — Hamilton DeSanctis & Cha

(57) ABSTRACT

Various embodiments of the present invention provide systems and methods for data processing. For example, data processing systems are disclosed that include: a data decoder circuit, a decoder log, a mis-correction detection circuit, and a controller circuit.

20 Claims, 4 Drawing Sheets

(56) References Cited

U.S. PATENT DOCUMENTS

| | | | |
|---|---|---|---|
| 6,272,659 B1* | 8/2001 | Zook | 714/774 |
| 6,438,724 B1* | 8/2002 | Cox et al. | 714/758 |
| 6,446,234 B1* | 9/2002 | Cox et al. | 714/758 |
| 6,493,846 B1* | 12/2002 | Kondo et al. | 714/794 |
| 6,694,477 B1* | 2/2004 | Lee | 714/784 |
| 6,810,094 B1* | 10/2004 | Lu | 375/341 |
| 6,847,601 B2* | 1/2005 | Kanai et al. | 369/59.17 |
| 7,178,086 B2* | 2/2007 | Hassner et al. | 714/758 |
| 7,395,491 B2* | 7/2008 | Chen | 714/780 |
| 7,685,497 B2* | 3/2010 | Kons | 714/759 |
| 8,020,069 B1* | 9/2011 | Feng et al. | 714/758 |
| 8,230,292 B2* | 7/2012 | Fujiwara et al. | 714/752 |
| 8,370,711 B2* | 2/2013 | Alrod et al. | 714/763 |
| 8,381,069 B1* | 2/2013 | Liu | 714/759 |
| 8,429,498 B1* | 4/2013 | Anholt et al. | 714/764 |
| 8,458,555 B2* | 6/2013 | Gunnam | 714/752 |
| 8,495,462 B1* | 7/2013 | Liu | 714/759 |
| 8,495,479 B1* | 7/2013 | Varnica et al. | 714/794 |
| 8,527,849 B2* | 9/2013 | Jakab et al. | 714/780 |
| 8,560,900 B1* | 10/2013 | Bellorado et al. | 714/718 |
| 2009/0161245 A1* | 6/2009 | Mathew et al. | 360/65 |
| 2010/0042890 A1 | 2/2010 | Gunnam et al. | |
| 2010/0287436 A1* | 11/2010 | Lastras-Montano et al. | 714/752 |
| 2011/0041040 A1* | 2/2011 | Su et al. | 714/773 |
| 2012/0005551 A1 | 1/2012 | Gunnam et al. | |
| 2012/0185744 A1* | 7/2012 | Varnica et al. | 714/752 |
| 2013/0024740 A1* | 1/2013 | Xia et al. | 714/746 |
| 2013/0031440 A1* | 1/2013 | Sharon et al. | 714/758 |
| 2013/0198580 A1* | 8/2013 | Chen et al. | 714/752 |
| 2013/0238955 A1* | 9/2013 | D'Abreu et al. | 714/763 |
| 2013/0254619 A1* | 9/2013 | Zhang et al. | 714/755 |

OTHER PUBLICATIONS

Lin et al "An efficient VLSI Architecture for non binary LDPC decoders"—IEEE Transaction on Circuits and Systems II vol. 57, Issue 1 (Jan. 2010) pp. 51-55.

Perisa et al "Frequency Offset Estimation Based on Phase Offsets Between Sample Correlations" Dept. of Info. Tech. University of Ulm 2005.

U.S. Appl. No. 13/450,289, Unpublished (filed Apr. 18, 2012) (Shaohua Yang).

U.S. Appl. No. 13/363,751, Unpublished (filed Feb. 1, 2012) (Lei Chen).

U.S. Appl. No. 13/284,754, Unpublished (filed Oct. 28, 2011) (Fan Zhang).

\* cited by examiner

SYSTEMS AND METHODS FOR BACK STEP DATA DECODING

BACKGROUND OF THE INVENTION

The present inventions are related to systems and methods for data processing, and more particularly to systems and methods for correcting mis-corrections.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. In some cases, the data processing function receives data sets and applies a data decode algorithm to the data sets to recover an originally written data set. In some cases, application of the data decoding process provides a correct result for internal decoder metrics suggesting that the result is correct when in fact it is not. Such mis-corrections can be difficult to detect and may be fatal to the operation of a recipient device.

Hence, for at least the aforementioned reasons, there exists a need in the art for advanced systems and methods for data processing.

BRIEF SUMMARY OF THE INVENTION

The present inventions are related to systems and methods for data processing, and more particularly to systems and methods for correcting mis-corrections.

Various embodiments of the present invention provide data processing systems that include: a data decoder circuit, a decoder log, a mis-correction detection circuit, and a controller circuit. The data decoder circuit is operable to: apply a data decode algorithm to a decoder input to yield a first decoded output; apply the data decode algorithm to the decoder input guided by the first decoded output to yield a second decoded output; and apply the data decode algorithm to the decoder input guided by a derivative of the first decoded output to yield a third decoded output. The decoder log is operable to store at least first decoded output. The mis-correction detection circuit is operable to identify a mis-correction in a derivative of the second decoded output. The controller circuit is operable to access the first decoded output from the decoder log, and to generate the derivative of the first decoded output. The element may be, but is not limited to, a bit or a symbol.

In some instances of the aforementioned embodiments, the data processing system is implemented as part of a storage device. In other instances of the aforementioned embodiments, the data processing system is implemented as part of a receiving device. In various instances of the aforementioned embodiments, the data processing system is implemented as part of an integrated circuit.

In various instances of the aforementioned embodiments, the derivative of the second decoded output is the same as the second decoded output. In some such instances, the mis-correction detection circuit is further operable to identify at least one element of the derivative of the second decoded output implicated in the mis-correction to the controller circuit. In particular cases, generating the derivative of the first decoded output includes modifying a soft data in the first decoded output to yield the derivative of the first decoded output. In such cases, the soft data corresponds to the location of the identified element in the derivative of the second decoded output. In one or more cases, the soft data is a log likelihood ratio. In such cases, modifying the log likelihood ratio includes increasing the log likelihood ratio to discourage changing the corresponding element during application of the data decode algorithm to the decoder input guided by the derivative of the first decoded output.

In other instances of the aforementioned embodiments, the data processing system further includes an element modification circuit operable to modify at least one element of the second decoded output to yield a converged output. In such instances, the derivative of the second decoded output is the converged output. In some such instances, the mis-correction detection circuit is further operable to identify at least one element of the derivative of the second decoded output implicated in the mis-correction to the controller circuit. Generating the derivative of the first decoded output includes modifying a soft data in the first decoded output to yield the derivative of the first decoded output. The soft data corresponds to the location of the identified element in the second decoded output. In particular cases, the soft data is a log likelihood ratio, and wherein modifying the log likelihood ratio includes increasing the log likelihood ratio to discourage changing the corresponding element when re-presented to the element modification circuit.

Other embodiments of the present invention provide methods for data processing. The methods include: applying a data decode algorithm to a decoder input by a data decoder circuit to yield a first decoded output; applying the data decode algorithm to the decoder input guided by the first decoded output to yield a third decoded output; applying the data decode algorithm to the decoder input guided by a derivative of the first decoded output to yield a third decoded output; storing the first decoded output to a decoder log; identifying a mis-correction in a derivative of the second decoded output; accessing the first decoded output from the decoder log; and generating the derivative of the first decoded output. In some cases, the derivative of the second decoded output is the same as the second decoded output. In various cases, the methods further include identifying at least one element of the derivative of the second decoded output implicated in the mis-correction to the controller circuit. In such cases, generating the derivative of the first decoded output includes modifying a soft data in the first decoded output to yield the derivative of the first decoded output. The soft data corresponds to the location of the identified element in the derivative of the second decoded output. In one particular case, the soft data is a log likelihood ratio. I such cases, modifying the log likelihood ratio includes increasing the log likelihood ratio to discourage changing the corresponding element during application of the data decode algorithm to the decoder input guided by the derivative of the first decoded output.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
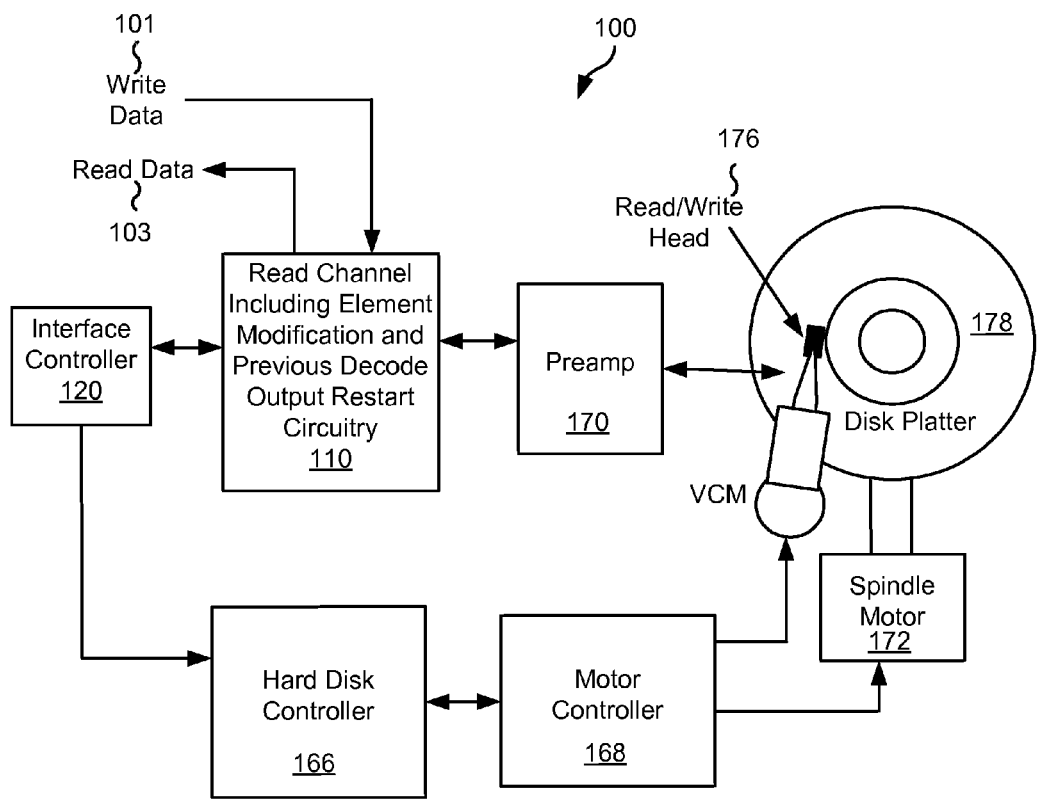
FIG. 1 shows a storage device including element modification and previous decode output restart circuitry in accordance with one or more embodiments of the present invention.

The present inventions are related to systems and methods for data processing, and more particularly to systems and methods for correcting mis-corrections.

Various embodiments of the present invention provide data processing systems that include a combination data decoder circuit that includes a low density parity check decoder circuit, an element modification circuit, a decoder iteration log memory, and a mis-correction detection circuit that together are used to identify a mis-correction and to correct the identified mis-correction. At the end of each local iteration (i.e., pass through low density parity check decoder circuit), the resulting decoded output is logged to a memory. Once an element modification condition is met, one or more elements of the current decoded output are modified by the element modification circuit, and the decoded output including the modified elements are passed to the low density parity check decoder circuit for re-application of the low parity check algorithm. This process continues until either a timeout occurs or until the decoded output converges (i.e., all parity checks are satisfied).

Once the decoded output converges, the mis-correction detection circuit determines whether the converged decoded output includes a mis-correction. In some cases, the mis-correction is identified using cyclic redundancy correction bits included in the decoded output. Where a mis-correction is identified, a decoded output from a previous local iteration that completed with unsatisfied checks is selected. In addition, soft data associated with one or more of the elements involved in the identified mis-correction is increased to discourage modification of those elements during future iterations of the rewound decoded output. The processes describe above are then repeated until the low density parity check decoder circuit converges again. In some cases, the elements selected for modification may be from an immediately preceding local iteration. In other cases, the elements selected for modification may be elements within a defined window of local iterations from k to k+m, where k is the first local iteration in the defined window, k+m is the last local iteration in the window, and m is the number of local iterations included in the window. Such an approach operates to modify mis-corrections that occur in clusters. The size of the window (m) may be one or more recent local iterations. In some cases, the window is a sliding window including one or more local iterations generated in the middle of a decoding process, and/or the logged y violated checks could be from the local iteration during the decoding process with the smallest non-zero number of violated checks. In such a case, the decoder log circuit is operable to record the unsatisfied checks for each local iterations or local iterations within the window either immediately before convergence or for local iterations occurring in the middle of the decoding process.

The element modification may be done using any bit or symbol modification algorithm known in the art. As one example, the bit modification may be done in accordance with that disclosed in U.S. patent application Ser. No. 13/284,754 entitled "Systems and Methods for Ambiguity Based Decode Algorithm Modification" and filed by Zhang et al. on Oct. 28, 2011. Alternatively, the bit modification may be done in accordance with that disclosed in U.S. patent application Ser. No. 13/274,443 entitled "LDPC Decoder with Targeted Symbol Flipping" and filed by Wang et al. on Oct. 17, 2011. The entirety of both of the aforementioned references is incorporated herein by reference for all purposes. Based upon the disclosure provided herein, one of ordinary skill in the art will recognize a variety of bit modification algorithms and/or circuitry that may be used in relation to different embodiments of the present invention.

Turning to FIG. 1, a storage device 100 is shown including element modification and previous decode output restart circuitry in accordance with one or more embodiments of the present invention. Storage device 100 may be, for example, a hard disk drive. Storage device 100 also includes a preamplifier 170, an interface controller 120, a hard disk controller 166, a motor controller 168, a spindle motor 172, a disk platter 178, and a read/write head assembly 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 178 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

During operation, data decoding is applied to the information received from disk platter 178. This data decoding may include a number of local iterations through a data decoder circuit with one or more results from respective iterations being stored. Where the output from the data decoding converges, it is determined whether the resulting output includes a mis-correction. Where it is determined that a mis-correction has occurred, an output from a previous local iteration that completed with unsatisfied checks is selected. In addition, soft data associated with one or more of the elements involved in the identified mis-correction is increased to discourage modification of those elements during future iterations of the rewound decoded output. The modified decoded output is then re-processed by application of the data decoding thereto. Such mis-correction identification and correction may be implemented similar to that discussed below in relation to FIG. 3, and/or may be done using a process similar to that discussed above in relation to FIG. 2 above.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Figure 2:
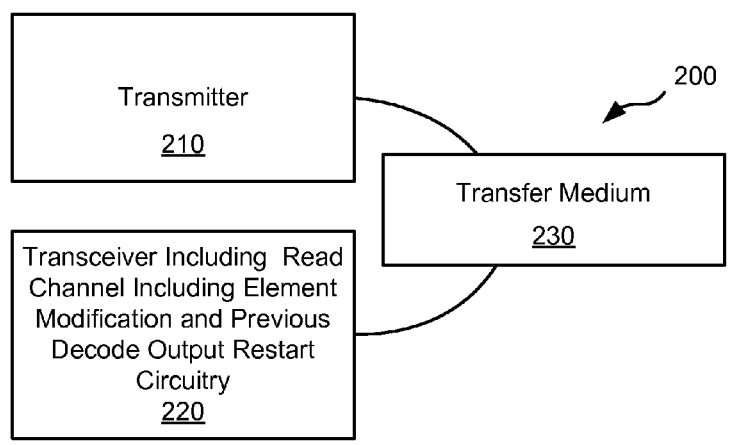
FIG. 2 shows a data transmission system including element modification and previous decode output restart circuitry in accordance with various embodiments of the present invention.

Turning to FIG. 2, a data transmission system 200 including element modification and previous decode output restart circuitry is shown in accordance with one or more embodiments of the present invention. Data transmission system 200 includes a transmitter 210 that is operable to transmit encoded information via a transfer medium 230 as is known in the art. The encoded data is received from transfer medium 230 by a receiver 220. Receiver 220 incorporates data decoder circuitry. While processing received data, received data is converted from an analog signal to a series of corresponding digital samples, and the digital samples are equalized to yield an equalized output. The equalized output is then provided to a data processing circuit including both a data detector circuit and a data decoder circuit. Data is passed between the data decoder and data detector circuit via a central memory allowing for variation between the number of processing iterations that are applied to different data sets. It should be noted that transfer medium 230 may be any transfer medium known in the art including, but not limited to, a wireless medium, an optical medium, or a wired medium. Based upon the disclosure provided herein, one of ordinary skill in the art will recognize a variety of transfer mediums that may be used in relation to different embodiments of the present invention.

During operation, data decoding is applied to the information received from transmission medium 230. This data decoding may include a number of local iterations through a data decoder circuit with one or more results from respective iterations being stored. Where the output from the data decoding converges, it is determined whether the resulting output includes a mis-correction. Where it is determined that a mis-correction has occurred, an output from a previous local iteration that completed with unsatisfied checks is selected. In addition, soft data associated with one or more of the elements involved in the identified mis-correction is increased to discourage modification of those elements during future iterations of the rewound decoded output. The modified decoded output is then re-processed by application of the data decoding thereto. Such mis-correction identification and correction may be implemented similar to that discussed below in relation to FIG. 3, and/or may be done using a process similar to that discussed above in relation to FIG. 2 above.

Figure 3:
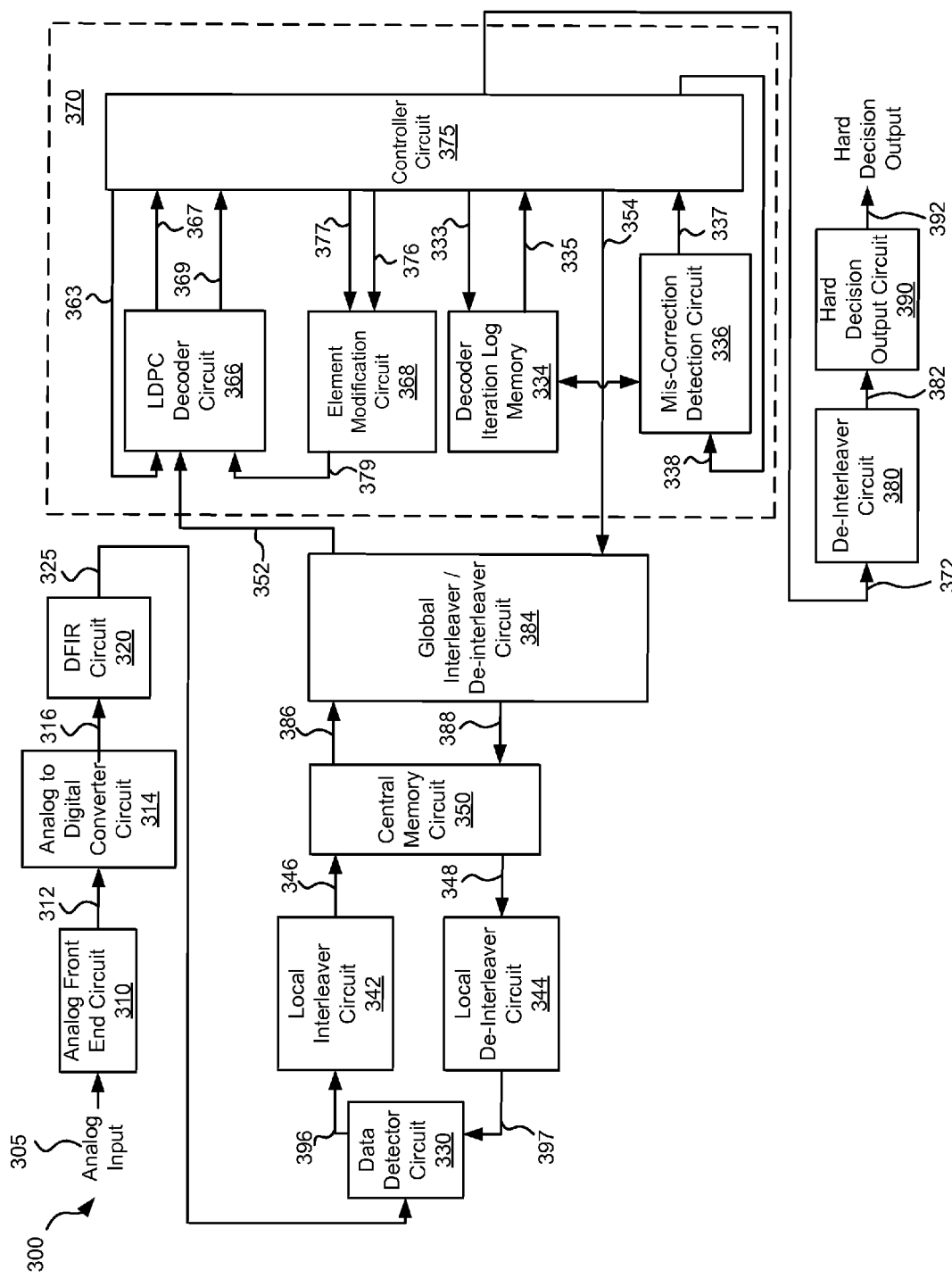
FIG. 3 shows a data processing circuit including a combination data decoder operable to correct mis-corrections in accordance with one or more embodiments of the present invention.

Turning to FIG. 3, a data processing circuit 300 is shown that includes a data decoding circuit 370 operable to correct mis-corrections in accordance with one or more embodiments of the present invention. Data decoding circuit 370 including a combination of a low density parity check decoder circuit 366, an element modification circuit 368, a decoder iteration log memory 334, and a mis-correction detection circuit 336 in accordance with one or more embodiments of the present invention. Data processing circuit 300 includes an analog front end circuit 310 that receives an analog signal 305. Analog front end circuit 310 processes analog signal 305 and provides a processed analog signal 312 to an analog to digital converter circuit 314. Analog front end circuit 310 may include, but is not limited to, an analog filter and an amplifier circuit as are known in the art. Based upon the disclosure provided herein, one of ordinary skill in the art will recognize a variety of circuitry that may be included as part of analog front end circuit 310. In some cases, analog signal 305 is derived from a read/write head assembly (not shown) that is disposed in relation to a storage medium (not shown). In other cases, analog signal 305 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 305 may be derived.

Analog to digital converter circuit 314 converts processed analog signal 312 into a corresponding series of digital samples 316. Analog to digital converter circuit 314 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 316 are provided to an equalizer circuit 320. Equalizer circuit 320 applies an equalization algorithm to digital samples 316 to yield an equalized output 325. In some embodiments of the present invention, equalizer circuit 320 is a digital finite impulse response filter circuit as are known in the art. In some cases, equalizer circuit 320 includes sufficient memory to maintain one or more codewords until a data detector circuit 330 is available for processing, and for multiple processes through data detector circuit 330.

Data detector circuit 330 is operable to apply a data detection algorithm to a received codeword or data set, and in some cases data detector circuit 330 can process two or more codewords in parallel. In some embodiments of the present invention, data detector circuit 330 is a Viterbi algorithm data detector circuit as are known in the art. In other embodiments of the present invention, data detector circuit 330 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Data detector circuit 330 is started based upon availability of a data set from equalizer circuit 320 or from a central memory circuit 350.

Upon completion, data detector circuit 330 provides a detector output 396. Detector output 396 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output 396 is provided to a local interleaver circuit 342. Local interleaver circuit 342 is operable to shuffle sub-portions (i.e., local chunks) of the data set included as detected output and provides an interleaved codeword 346 that is stored to central memory circuit 350. Interleaver circuit 342 may be any circuit known in the art that is capable of shuffling data sets to yield a re-arranged data set. Interleaved codeword 346 is stored to central memory circuit 350.

Once a data decoding circuit 370 is available, a previously stored interleaved codeword 346 is accessed from central memory circuit 350 as a stored codeword 386 and globally interleaved by a global interleaver/de-interleaver circuit 384. Global interleaver/De-interleaver circuit 384 may be any circuit known in the art that is capable of globally rearranging codewords. Global interleaver/De-interleaver circuit 384 provides a decoder input 352 to data decoding circuit 370.

Data decoding circuit 370 includes low density parity check decoder circuit 366, element modification circuit 368, decoder iteration log memory 334, and mis-correction detection circuit 336. Low density parity check decoder circuit 366 applies a low density parity check decoding algorithm to decoder input 352 to yield a decoded output 367 and unsatisfied check equation identification 369 to a controller circuit 375. Among other things, controller circuit 375 provides decoder output 367 as a decoder output 333 to a decoder iteration log memory 334 which is stored, and provides a decoder output 363 to low density parity check decoder circuit 366 where it can be used to guide a subsequent application of the low density parity check decoding algorithm to decoder input 352 by low density parity check decoder circuit 366. As more fully described below, decoder output 363 can be decoder output 367, or a modified version of a decoder output. As described below, this logged information maintained in decoder iteration log memory 334 can be used to reset to a decoder output from an earlier local iteration to resolve a mis-correction.

Controller circuit 375 utilizes decoder output 367 and unsatisfied check equation identification 369 to determine whether decoder output 367 converged (i.e., all parity check equations were satisfied). Where decoder output 367 converged, unsatisfied check equation identification 369 does not indicate any unsatisfied checks. Where decoder output 367 failed to converge, it is determined by controller circuit 375 whether an element modification condition has been met. In some cases, an element modification condition is found to be met where the number of remaining unsatisfied checks after application of the decoder algorithm by low density parity check decoder circuit 366 to decoder input 352 is less than ten, and the indexes corresponding to the remaining unsatisfied checks (i.e., unsatisfied check equation identification 369) have not changed for at least two local iterations (i.e., passes through low density parity check decoder circuit 366). In addition, in some cases, controller circuit 375 is not enabled to indicate that the bit modification condition has been met until at least four local iterations of the low density parity check decoder algorithm applied to decoder input 352 have completed. Based upon the disclosure provided herein, one of ordinary skill in the art will recognize other indicia that may be used to define the occurrence of an element modification condition.

Where the data decoding algorithm as applied by low density parity check decoder circuit 366 failed to converge and no more local iterations (iterations through low density parity check decoder circuit 366) are allowed, controller circuit 375 provides a decoder output 354 (i.e., decoder output 367) back to central memory circuit 350 via global interleaver/de-interleaver circuit 384. Prior to storage of decoded output 354 to central memory circuit 350, decoded output 354 is globally de-interleaved to yield a globally de-interleaved output 388 that is stored to central memory circuit 350. The global de-interleaving reverses the global interleaving earlier applied to stored codeword 386 to yield decoder input 352. Once data detector circuit 330 is available, a previously stored de-interleaved output 388 is accessed from central memory circuit 350 and locally de-interleaved by a de-interleaver circuit 344. De-interleaver circuit 344 re-arranges decoder output 348 to reverse the shuffling originally performed by interleaver circuit 342. A resulting de-interleaved output 397 is provided to data detector circuit 330 where it is used to guide subsequent detection of a corresponding data set receive as equalized output 325.

Alternatively, where the data decoding algorithm applied by low density parity check decoder circuit 366 failed to converge, more local iterations (iterations through low density parity check decoder circuit 366) are allowed, and the aforementioned element modification condition is met, controller circuit 375 provides a soft data subset 377 corresponding to a portion of decoder output 367 related to unsatisfied parity checks indicated by unsatisfied check equation identification 376 (i.e., a pass through of unsatisfied check equation identification 369) to element modification circuit 368. Element modification circuit 368 is operable to determine one or more probable bits or symbols associated with the remaining unsatisfied checks to be modified. The identified bits or symbols are then modified by element modification circuit 368 and provided as a replacement symbol output 379 where it is used to replace the corresponding symbol in decoder output 363 (where decoder output 363 is a copy of decoder output 367) for a subsequent iteration through low density parity check decoder circuit 366. The element modification algorithm may be any element modification algorithm known in the art. As one example, the element modification may be done in accordance with that disclosed in "Systems and Methods for Ambiguity Based Decode Algorithm Modification" filed by Zhang et al. on Oct. 28, 2011; or with that disclosed in "LDPC Decoder with Targeted Symbol Flipping" filed by Wang et al. on Oct. 37, 2011. The entirety of both of the aforementioned references was previously incorporated herein by reference for all purposes. Based upon the disclosure provided herein, one of ordinary skill in the art will recognize a variety of element modification algorithms and/or circuitry that may be used in relation to different embodiments of the present invention.

The process of applying the low density parity check equation including, where applicable, performing element modification, is done until either a timeout condition occurs or decoded output 367 converges. The timeout condition may include, but is not limited to an exhaustion of a maximum number of local iterations (i.e., passes through low density parity check decoder circuit 366) or global iterations (i.e., passes through a combination of data detector circuit 330 and data decoding circuit 370.

Where decoder output 367 converges, controller circuit 375 provides it to mis-correction detection circuit 336 as a decoder output 338. Mis-correction detection circuit 336 uses cyclic redundancy correction bits included in decoder output 338 to assure that the corresponding cyclic redundancy checks are satisfied. A mis-correction has occurred where the cyclic redundancy checks are not satisfied. As used herein, the term "mis-correction" is used in its broadest sense to mean any modification made during application of the decoding algorithm that satisfied decoding requirements, but does not satisfy another external check. In one particular embodiment of the present invention, a mis-correction occurs where a low density parity check algorithm applied by low density parity check decoder circuit 366 is satisfied, but a cyclic redundancy check applied by mis-correction detection and modification rewind circuit 336 is not satisfied.

Where a mis-correction is identified by mis-correction detection circuit 336, mis-correction detection circuit 336 provides a mis-correction output 337 to controller circuit 375, and identifies a decoder output maintained in decoder iteration log memory 334 to decoder iteration log memory 344. The identified decoder output is from a prior local iteration through low density parity check decoder circuit 366. In one particular embodiment of the present invention, the identified decoder output is the decoder output from a previous local iteration of low density parity check decoder circuit 366 that exhibits both at least one unsatisfied check, and the lowest number of unsatisfied checks. Based upon the disclosure provided herein, one of ordinary skill in the art will recognize a variety of conditions that may be used to select the identified decoder output in accordance with different embodiments of the present invention. Decoder iteration log memory 334 provides the decoder output identified by mis-correction detection circuit 336 to controller circuit 375 as a decoder output 335. Decoder output 335 is then provided by controller circuit 375 as decoder output 363 to low density parity check decoder circuit 366 where it can be used to guide a subsequent application of the low density parity check decoding algorithm to decoder input 352 by low density parity check decoder circuit 366.

In this way, a decoder output from a previously completed local iteration through low density parity check decoder circuit 366 may be used as a reset point when a mis-correction is identified. In addition, mis-correction detection circuit 336 identifies one or more elements of decoder output 338 that are related to the identified mis-correction. In turn, controller circuit 375 modifies the soft data associated with the identified one or more elements. In particular, the soft data is increased to discourage modification of the corresponding elements by element modification circuit 368 and/or low density parity check decoder circuit 366 during subsequent iterations. In addition, in some cases, the soft data corresponding to one or more other elements around the aforementioned identified elements is decreased to encourage modification of the other corresponding elements by element modification circuit 368 and/or low density parity check decoder circuit 366 during subsequent iterations.

Alternatively, where a mis-correction is not identified by mis-correction detection and modification rewind circuit 336, controller circuit 375 provides the converged decoded output 367 as an output codeword 372 to a de-interleaver circuit 380. De-interleaver circuit 380 rearranges the data to reverse both the global and local interleaving applied to the data to yield a de-interleaved output 382. De-interleaved output 382 is provided to a hard decision output circuit 390. Hard decision output circuit 390 is operable to re-order data sets that may complete out of order back into their original order. The originally ordered data sets are then provided as a hard decision output 392.

Figure 4:
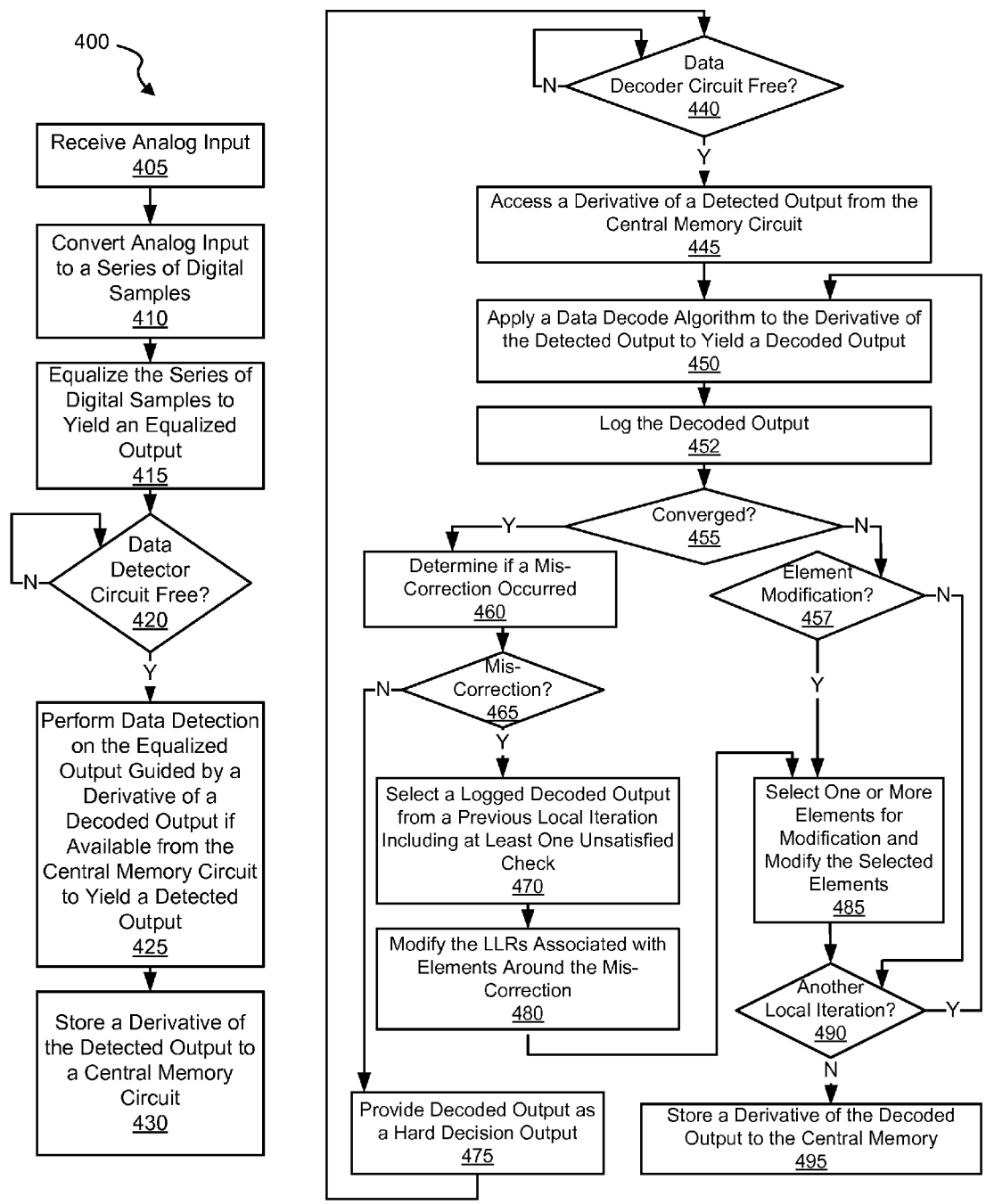
FIG. 4 is a flow diagram showing a method for identifying and correcting mis-corrections in accordance with one or more embodiments of the present invention.

Turning to FIG. 4, a flow diagram 400 shows a method for identifying and correcting mis-corrections in accordance with one or more embodiments of the present invention. Following flow diagram 400, an analog input is received (block 405). The analog input may be derived from, for example, a storage medium or a data transmission channel. Based upon the disclosure provided herein, one of ordinary skill in the art will recognize a variety of sources of the analog input. The analog input is converted to a series of digital samples (block 410). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 415). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention.

It is determined whether a data detector circuit is available (block 420). Where a data detector circuit is available (block 420), a data detection algorithm is applied to the equalized output guided by a data set derived from a decoded output where available (e.g., the second and later iterations through the data detector circuit and the data decoder circuit) from a central memory circuit to yield a detected output (block 425). In some embodiments of the present invention, data detection algorithm is a Viterbi algorithm as are known in the art. In other embodiments of the present invention, the data detection algorithm is a maximum a posteriori data detector circuit as are known in the art. The data set derived from the decoded output maybe a de-interleaved version of the decoded data set. A signal derived from the detected output (e.g., a locally interleaved version of the detected output) is stored to the central memory to await processing by a data decoder circuit (block 430).

In parallel to the previously discussed data detection processing, it is determined whether a data decoder circuit is available (block 440). Where the data decoder circuit is available (block 440), a previously stored derivative of a detected output is accessed from the central memory (block 445). A low density parity check decode algorithm is applied to the derivative of the detected output to yield a decoded output (block 450), and the decoded output is logged to a decoder iteration log memory (block 452). It is determined whether the decoded output converged (block 455). Convergence occurs where all of the parity checks applied as part of applying the low density parity check decoding algorithm are satisfied.

Where the decoded output failed to converge (block 455), it is determined whether an element modification condition has been met (block 457). In some cases, an element modification condition is found to be met where the number of remaining unsatisfied checks after application of the decoder algorithm is less than ten, and the particular parity equations central to the remaining unsatisfied checks have not changed for at least two local iterations (i.e., passes through application of the low density parity check algorithm). In addition, in some cases, the element modification condition is not enabled to occur until at least four local iterations applying the low density parity check algorithm have completed. Based upon the disclosure provided herein, one of ordinary skill in the art will recognize other indicia that may be used to define the occurrence of a element modification condition.

Where the element modification condition has not occurred (block 457), it is determined whether another local iteration is to be performed (block 490). In some cases, this is determined by comparing the number of local iterations that have been completed to a defined threshold number. Where another local iteration is not called for or allowed (e.g., the number of local iterations equals a maximum number of local iterations)(block 490), the decoded output is stored to the central memory circuit where it awaits processing by the data detector circuit (i.e., another global iteration) (block 495). Otherwise, where it is determined that another local iteration is called for or allowed (e.g., the number of local iterations is not equal to a maximum number of local iterations)(block 490), the processes of blocks 450-495 are repeated for the same data set using the previous decoded output as a guide.

Alternatively, where the element modification condition has occurred (block 457), one or more bits or symbols within the decoded output are selected for modification (block 485). The bit modification algorithm may be any bit modification algorithm known in the art. As one example, the element modification may be done in accordance with that disclosed in "Systems and Methods for Ambiguity Based Decode Algorithm Modification" filed by Zhang et al. on Oct. 48, 4011; or with that disclosed in "LDPC Decoder with Targeted Symbol Flipping" filed by Wang et al. on Oct. 17, 4011. The entirety of both of the aforementioned references was previously incorporated herein by reference for all purposes. Based upon the disclosure provided herein, one of ordinary skill in the art will recognize a variety of bit modification algorithms and/or circuitry that may be used in relation to different embodiments of the present invention. The processes of block 490 and those subsequent are performed using the modified output.

Where, on the other hand, the decoded output converged (block 455), it is determined whether the decoded output includes a mis-correction (block 460). Such a determination of a mis-correction may be determined, for example, using cyclic redundancy check data included in the decoded output. A mis-correction has occurred where the cyclic redundancy checks are not satisfied. Where no mis-corrections are identified (block 465), the decoded output is provided as a hard decision output (block 475), and the process returns to block 440. Alternatively, where a mis-correction is identified (block 465), a decoded output stored in the decoder iteration log memory is selected to replace the current decoded output (block 470). In one particular embodiment of the present invention, the selected decoded output is the decoder output from a previous local iteration of the low density parity check algorithm that exhibits both at least one unsatisfied check, and the lowest number of unsatisfied checks. Based upon the disclosure provided herein, one of ordinary skill in the art will recognize a variety of conditions that may be used to select the identified decoder output in accordance with different embodiments of the present invention. In addition, the log likelihood ratio data associated with elements of the selected decoded output corresponding to mis-corrected elements in the current decoded output are modified (block 480). In particular, the log likelihood ratio data is increased to discourage modification of the corresponding elements by the element modification process of block 485. In addition, in some cases, the log likelihood ratio data corresponding to one or more other elements around the aforementioned elements corresponding to the mis-correction is decreased to encourage modification of the other corresponding elements by the element modification process of block 485 during subsequent iterations. At this juncture, the processes beginning at block 485 are repeated using the decoded output selected from the decoder iteration log memory with the log likelihood ratio modifications.

Turning to FIG. 4, a flow diagram 400 shows a method for identifying and correcting mis-corrections in accordance with one or more embodiments of the present invention. Following flow diagram 400, an analog input is received (block 405). The analog input may be derived from, for example, a storage medium or a data transmission channel. Based upon the disclosure provided herein, one of ordinary skill in the art will recognize a variety of sources of the analog input. The analog input is converted to a series of digital samples (block 410). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 415). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention.

It is determined whether a data detector circuit is available (block 420). Where a data detector circuit is available (block 420), a data detection algorithm is applied to the equalized output guided by a data set derived from a decoded output where available (e.g., the second and later iterations through the data detector circuit and the data decoder circuit) from a central memory circuit to yield a detected output (block 425). In some embodiments of the present invention, data detection algorithm is a Viterbi algorithm as are known in the art. In other embodiments of the present invention, the data detection algorithm is a maximum a posteriori data detector circuit as are known in the art. The data set derived from the decoded output maybe a de-interleaved version of the decoded data set. A signal derived from the detected output (e.g., a locally interleaved version of the detected output) is stored to the central memory to await processing by a data decoder circuit (block 430).

In parallel to the previously discussed data detection processing, it is determined whether a data decoder circuit is available (block 440). Where the data decoder circuit is available (block 440), a previously stored derivative of a detected output is accessed from the central memory (block 445). A low density parity check decode algorithm is applied to the derivative of the detected output to yield a decoded output (block 450), and the decoded output is logged to a decoder iteration log memory (block 452). It is determined whether the decoded output converged (block 455). Convergence occurs where all of the parity checks applied as part of applying the low density parity check decoding algorithm are satisfied.

Where the decoded output failed to converge (block 455), it is determined whether an element modification condition has been met (block 457). In some cases, an element modification condition is found to be met where the number of remaining unsatisfied checks after application of the decoder algorithm is less than ten, and the particular parity equations central to the remaining unsatisfied checks have not changed for at least two local iterations (i.e., passes through application of the low density parity check algorithm). In addition, in some cases, the element modification condition is not enabled to occur until at least four local iterations applying the low density parity check algorithm have completed. Based upon the disclosure provided herein, one of ordinary skill in the art will recognize other indicia that may be used to define the occurrence of a element modification condition.

Where the element modification condition has not occurred (block 457), it is determined whether another local iteration is to be performed (block 490). In some cases, this is determined by comparing the number of local iterations that have been completed to a defined threshold number. Where another local iteration is not called for or allowed (e.g., the number of local iterations equals a maximum number of local iterations)(block 490), the decoded output is stored to the central memory circuit where it awaits processing by the data detector circuit (i.e., another global iteration) (block 495). Otherwise, where it is determined that another local iteration is called for or allowed (e.g., the number of local iterations is not equal to a maximum number of local iterations)(block 490), the processes of blocks 450-495 are repeated for the same data set using the previous decoded output as a guide.

Alternatively, where the element modification condition has occurred (block 457), one or more bits or symbols within the decoded output are selected for modification (block 485). The bit modification algorithm may be any bit modification algorithm known in the art. As one example, the element modification may be done in accordance with that disclosed in "Systems and Methods for Ambiguity Based Decode Algorithm Modification" filed by Zhang et al. on Oct. 48, 4011; or with that disclosed in "LDPC Decoder with Targeted Symbol Flipping" filed by Wang et al. on Oct. 17, 4011. The entirety of both of the aforementioned references was previously incorporated herein by reference for all purposes. Based upon the disclosure provided herein, one of ordinary skill in the art will recognize a variety of bit modification algorithms and/or circuitry that may be used in relation to different embodiments of the present invention. The processes of block 490 and those subsequent are performed using the modified output.

Where, on the other hand, the decoded output converged (block 455), it is determined whether the decoded output includes a mis-correction (block 460). Such a determination of a mis-correction may be determined, for example, using cyclic redundancy check data included in the decoded output. A mis-correction has occurred where the cyclic redundancy checks are not satisfied. Where no mis-corrections are identified (block 465), the decoded output is provided as a hard decision output (block 475), and the process returns to block 440. Alternatively, where a mis-correction is identified (block 465), a decoded output stored in the decoder iteration log memory is selected to replace the current decoded output (block 470). In one particular embodiment of the present invention, the selected decoded output is the decoder output from a previous local iteration of the low density parity check algorithm that exhibits both at least one unsatisfied check, and the lowest number of unsatisfied checks. Based upon the disclosure provided herein, one of ordinary skill in the art will recognize a variety of conditions that may be used to select the identified decoder output in accordance with different embodiments of the present invention. In addition, the log likelihood ratio data associated with elements of the selected decoded output corresponding to mis-corrected elements in the current decoded output are modified (block 480). In particular, the log likelihood ratio data is increased to discourage modification of the corresponding elements by the element modification process of block 485. In addition, in some cases, the log likelihood ratio data corresponding to one or more other elements around the aforementioned elements corresponding to the mis-correction is decreased to encourage modification of the other corresponding elements by the element modification process of block 485 during subsequent iterations. At this juncture, the processes beginning at block 485 are repeated using the decoded output selected from the decoder iteration log memory with the log likelihood ratio modifications.

Figure 5:
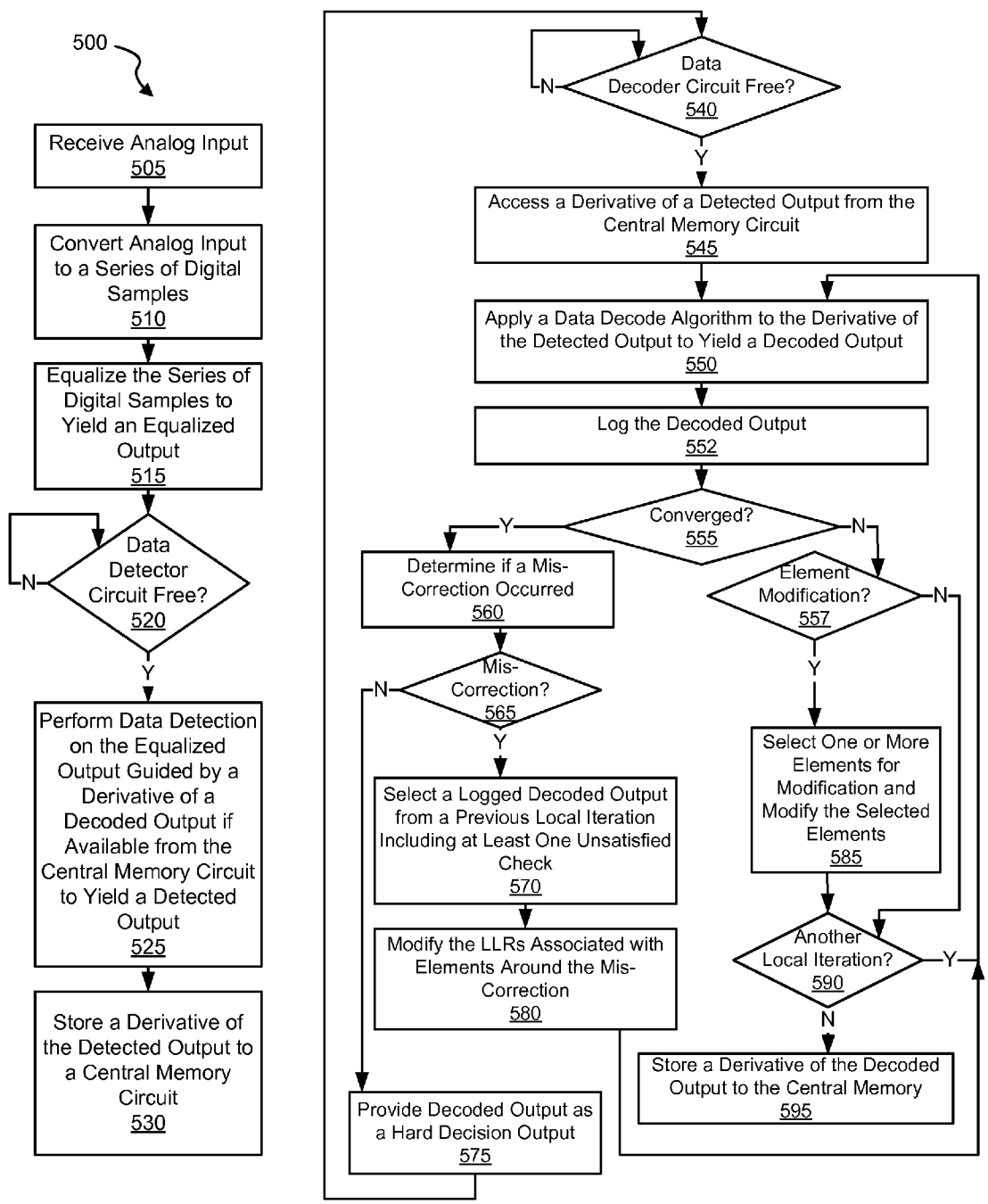
FIG. 5 is a flow diagram showing another method for identifying and correcting mis-corrections in accordance with one or more embodiments of the present invention.

Turning to FIG. 5, a flow diagram 500 shows a method for identifying and correcting mis-corrections in accordance with one or more embodiments of the present invention. Following flow diagram 500, an analog input is received (block 505). The analog input may be derived from, for example, a storage medium or a data transmission channel. Based upon the disclosure provided herein, one of ordinary skill in the art will recognize a variety of sources of the analog input. The analog input is converted to a series of digital samples (block 510). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 515). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention.

It is determined whether a data detector circuit is available (block 520). Where a data detector circuit is available (block 520), a data detection algorithm is applied to the equalized output guided by a data set derived from a decoded output where available (e.g., the second and later iterations through the data detector circuit and the data decoder circuit) from a central memory circuit to yield a detected output (block 525). In some embodiments of the present invention, data detection algorithm is a Viterbi algorithm as are known in the art. In other embodiments of the present invention, the data detection algorithm is a maximum a posteriori data detector circuit as are known in the art. The data set derived from the decoded output maybe a de-interleaved version of the decoded data set. A signal derived from the detected output (e.g., a locally interleaved version of the detected output) is stored to the central memory to await processing by a data decoder circuit (block 530).

In parallel to the previously discussed data detection processing, it is determined whether a data decoder circuit is available (block 540). Where the data decoder circuit is available (block 540), a previously stored derivative of a detected output is accessed from the central memory (block 545). A low density parity check decode algorithm is applied to the derivative of the detected output to yield a decoded output (block 550), and the decoded output is logged to a decoder iteration log memory (block 552). It is determined whether the decoded output converged (block 555). Convergence occurs where all of the parity checks applied as part of applying the low density parity check decoding algorithm are satisfied.

Where the decoded output failed to converge (block 555), it is determined whether an element modification condition has been met (block 557). In some cases, an element modification condition is found to be met where the number of remaining unsatisfied checks after application of the decoder algorithm is less than ten, and the particular parity equations central to the remaining unsatisfied checks have not changed for at least two local iterations (i.e., passes through application of the low density parity check algorithm). In addition, in some cases, the element modification condition is not enabled to occur until at least four local iterations applying the low density parity check algorithm have completed. Based upon the disclosure provided herein, one of ordinary skill in the art will recognize other indicia that may be used to define the occurrence of a element modification condition.

Where the element modification condition has not occurred (block 557), it is determined whether another local iteration is to be performed (block 590). In some cases, this is determined by comparing the number of local iterations that have been completed to a defined threshold number. Where another local iteration is not called for or allowed (e.g., the number of local iterations equals a maximum number of local iterations)(block 590), the decoded output is stored to the central memory circuit where it awaits processing by the data detector circuit (i.e., another global iteration) (block 595). Otherwise, where it is determined that another local iteration is called for or allowed (e.g., the number of local iterations is not equal to a maximum number of local iterations)(block 590), the processes of blocks 550-595 are repeated for the same data set using the previous decoded output as a guide.

Alternatively, where the element modification condition has occurred (block 557), one or more bits or symbols within the decoded output are selected for modification (block 585). The bit modification algorithm may be any bit modification algorithm known in the art. As one example, the element modification may be done in accordance with that disclosed in "Systems and Methods for Ambiguity Based Decode Algorithm Modification" filed by Zhang et al. on Oct. 48, 4011; or with that disclosed in "LDPC Decoder with Targeted Symbol Flipping" filed by Wang et al. on Oct. 17, 4011. The entirety of both of the aforementioned references was previously incorporated herein by reference for all purposes. Based upon the disclosure provided herein, one of ordinary skill in the art will recognize a variety of bit modification algorithms and/or circuitry that may be used in relation to different embodiments of the present invention. In some cases, the elements selected for modification may be from the preceding local iteration. In other cases, the elements selected for modification may be elements within a defined window of local iterations from k to k+m, where k is the first local iteration in the defined window, k+m is the last local iteration in the window, and m is the number of local iterations included in the window. Such an approach operates to modify mis-corrections that occur in clusters. The size of the window (m) may be one or more recent local iterations. In some cases, the window is a sliding window including one or more local iterations generated in the middle of a decoding process, and/or the logged y violated checks could be from the local iteration during the decoding process with the smallest non-zero number of violated checks. In such a case, the decoder log circuit is operable to record the unsatisfied checks for each local iterations or local iterations within the window either immediately before convergence or for local iterations occurring in the middle of the decoding process. The processes of block 590 and those subsequent are performed using the modified output.

Where, on the other hand, the decoded output converged (block 555), it is determined whether the decoded output includes a mis-correction (block 560). Such a determination of a mis-correction may be determined, for example, using cyclic redundancy check data included in the decoded output. A mis-correction has occurred where the cyclic redundancy checks are not satisfied. Where no mis-corrections are identified (block 565), the decoded output is provided as a hard decision output (block 575), and the process returns to block 440. Alternatively, where a mis-correction is identified (block 565), a decoded output stored in the decoder iteration log memory is selected to replace the current decoded output (block 570). In one particular embodiment of the present invention, the selected decoded output is the decoder output from a previous local iteration of the low density parity check algorithm that exhibits both at least one unsatisfied check, and the lowest number of unsatisfied checks. Based upon the disclosure provided herein, one of ordinary skill in the art will recognize a variety of conditions that may be used to select the identified decoder output in accordance with different embodiments of the present invention. In addition, the log likelihood ratio data associated with elements of the selected decoded output corresponding to mis-corrected elements in the current decoded output are modified (block 580). In particular, the log likelihood ratio data is increased to discourage modification of the corresponding elements by the element modification process of block 585. In addition, in some cases, the log likelihood ratio data corresponding to one or more other elements around the aforementioned elements corresponding to the mis-correction is decreased to encourage modification of the other corresponding elements by the element modification process of block 585 during subsequent iterations. At this juncture, the processes beginning at block 550 are repeated using the decoded output selected from the decoder iteration log memory with the log likelihood ratio modifications to guide application of the low density parity check decoding algorithm to the derivative of the detected output.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
    a data decoder circuit configured to:
        apply a data decode algorithm to a decoder input to yield a first decoded output;
        apply the data decode algorithm to the decoder input guided by the first decoded output to yield a second decoded output;
        apply the data decode algorithm to the decoder input guided by a derivative of the first decoded output to yield a third decoded output;
    a decoder log configured to store at least the first decoded output;
    a mis-correction detection circuit configured to identify a mis-correction in a derivative of the second decoded output; and
    a controller circuit configured to access the first decoded output from the decoder log, and generate the derivative of the first decoded output.

2. The data processing system of claim 1, wherein the derivative of the second decoded output is the same as the second decoded output.

3. The data processing system of claim 2, wherein the mis-correction detection circuit is further configured to identify at least one element of the derivative of the second decoded output implicated in the mis-correction to the controller circuit.

4. The data processing system of claim 3, wherein generating the derivative of the first decoded output includes:
    modifying a soft data in the first decoded output to yield the derivative of the first decoded output, wherein the soft data corresponds to the location of the identified element in the derivative of the second decoded output.

5. The data processing system of claim 4, wherein the soft data is a log likelihood ratio, and wherein modifying the log likelihood ratio includes increasing the log likelihood ratio to discourage changing the corresponding element during application of the data decode algorithm to the decoder input guided by the derivative of the first decoded output.

6. The data processing system of claim 1, wherein the data processing system further comprises:
    an element modification circuit configured to modify at least one element of the second decoded output to yield a converged output, wherein the derivative of the second decoded output is the converged output.

7. The data processing system of claim 6, wherein the mis-correction detection circuit is further configured to identify at least one element of the derivative of the second decoded output implicated in the mis-correction to the controller circuit, wherein generating the derivative of the first decoded output includes modifying a soft data in the first decoded output to yield the derivative of the first decoded output, and wherein the soft data corresponds to the location of the identified element in the second decoded output.

8. The data processing system of claim 7, wherein the soft data is a log likelihood ratio, and wherein modifying the log likelihood ratio includes increasing the log likelihood ratio to discourage changing the corresponding element when re-presented to the element modification circuit.

9. The data processing system of claim 1, wherein an element is selected from a group consisting of: a bit and a symbol.

10. The data processing circuit of claim 1, wherein the data processing system is implemented as part of a device selected from a group consisting of: a storage device, and a receiving device.

11. The data processing system of claim 1, wherein the data processing system is implemented as part of an integrated circuit.

12. The data processing system of claim 1, wherein the data processing system further comprises:
    a data detector circuit configured to apply a data detection algorithm to an input data set to yield a detected output, wherein the decoder input is derived from the detector output.

13. A method for data processing, the method comprising:
    applying a data decode algorithm to a decoder input by a data decoder circuit to yield a first decoded output;
    applying the data decode algorithm to the decoder input guided by the first decoded output to yield a third decoded output;
    applying the data decode algorithm to the decoder input guided by a derivative of the first decoded output to yield a third decoded output;
    storing the first decoded output to a decoder log;
    identifying a mis-correction in a derivative of the second decoded output;
    accessing the first decoded output from the decoder log; and
    generating the derivative of the first decoded output.

14. The method of claim 13, wherein the derivative of the second decoded output is the same as the second decoded output.

15. The method of claim 14, wherein the method further comprises:
    identifying at least one element of the derivative of the second decoded output implicated in the mis-correction to a controller circuit; and
    wherein generating the derivative of the first decoded output includes modifying a soft data in the first decoded output to yield the derivative of the first decoded output, and wherein the soft data corresponds to the location of the identified element in the derivative of the second decoded output.

16. The method of claim 15, wherein the soft data is a log likelihood ratio, and wherein modifying the log likelihood ratio includes increasing the log likelihood ratio to discourage changing the corresponding element during application of the data decode algorithm to the decoder input guided by the derivative of the first decoded output.

17. The method of claim 13, wherein the method further comprises:
modifying at least one element of the second decoded output to yield a converged output, wherein the derivative of the second decoded output is the converged output; and
identifying at least one element of the derivative of the second decoded output implicated in the mis-correction to a controller circuit, wherein generating the derivative of the first decoded output includes modifying a soft data in the first decoded output to yield the derivative of the first decoded output, and wherein the soft data corresponds to the location of the identified element in the second decoded output.

18. The method of claim 17, wherein the soft data is a log likelihood ratio, and wherein modifying the log likelihood ratio includes increasing the log likelihood ratio to discourage changing the corresponding element when re-presented to the element modification circuit.

19. A storage device, the storage device comprising:
a storage medium;
a head assembly disposed in relation to the storage medium and configured to provide a sensed signal corresponding to information on the storage medium;
a read channel circuit including:
an analog to digital converter circuit configured to sample an analog signal derived from the sensed signal to yield a series of digital samples;
an equalizer circuit configured to equalize the digital samples to yield a data set;
a data detector circuit configured to apply a data detection algorithm to the data set to yield a detected output; and
a data decoder circuit configured to: apply a data decode algorithm to a decoder input to yield a first decoded output, wherein the decoder input is derived from the detected output; apply the data decode algorithm to the decoder input guided by the first decoded output to yield a second decoded output; and apply the data decode algorithm to the decoder input guided by a derivative of the first decoded output to yield a third decoded output;
a decoder log configured to store at least first decoded output;
a mis-correction detection circuit configured to identify a mis-correction in a derivative of the second decoded output; and
a controller circuit configured to access the first decoded output from the decoder log, and generate the derivative of the first decoded output.

20. The storage device of claim 19, wherein the derivative of the second decoded output is the same as the second decoded output, wherein the mis-correction detection circuit is further configured to identify at least one element of the derivative of the second decoded output implicated in the mis-correction to the controller circuit, and wherein generating the derivative of the first decoded output includes modifying a soft data in the first decoded output to yield the derivative of the first decoded output, and wherein the soft data corresponds to the location of the identified element in the derivative of the second decoded output.

* * * * *